United States Patent
Chen et al.

(10) Patent No.: US 11,749,359 B2
(45) Date of Patent: *Sep. 5, 2023

(54) SHORT PROGRAM VERIFY RECOVERY WITH REDUCED PROGRAMMING DISTURBANCE IN A MEMORY SUB-SYSTEM

(71) Applicant: Micron Technology, Inc., Boise, ID (US)

(72) Inventors: Hong-Yan Chen, San Jose, CA (US); Yingda Dong, Los Altos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/702,525

(22) Filed: Mar. 23, 2022

(65) Prior Publication Data

US 2022/0215890 A1 Jul. 7, 2022

Related U.S. Application Data

(63) Continuation of application No. 17/689,862, filed on Mar. 8, 2022, which is a continuation of application No. 16/946,273, filed on Jun. 12, 2020, now Pat. No. 11,282,582.

(51) Int. Cl.
| | |
|---|---|
| G11C 16/04 | (2006.01) |
| G11C 16/34 | (2006.01) |
| G11C 16/08 | (2006.01) |
| G11C 16/26 | (2006.01) |
| G11C 16/10 | (2006.01) |

(52) U.S. Cl.
CPC .......... *G11C 16/3436* (2013.01); *G11C 16/08* (2013.01); *G11C 16/10* (2013.01); *G11C 16/26* (2013.01); *G11C 16/3413* (2013.01)

(58) Field of Classification Search
CPC ..... G11C 16/3436; G11C 16/08; G11C 16/10; G11C 16/26; G11C 16/3413
See application file for complete search history.

(56) References Cited

U.S. PATENT DOCUMENTS

| | | | |
|---|---|---|---|
| 10,283,204 B2 | 5/2019 | Choi et al. | |
| 10,467,133 B2 | 11/2019 | Perlstein et al. | |
| 10,671,529 B2 | 6/2020 | Yoon et al. | |
| 10,902,922 B2 | 1/2021 | Seo et al. | |
| 11,282,582 B2 * | 3/2022 | Chen | G11C 16/3459 |
| 2017/0263306 A1 * | 9/2017 | Murphy | G11C 7/08 |
| 2022/0051724 A1 * | 2/2022 | Koushan | G11C 16/0483 |
| 2022/0100941 A1 * | 3/2022 | Catthoor | G06F 12/0284 |
| 2022/0189565 A1 * | 6/2022 | Chen | G11C 16/26 |

* cited by examiner

*Primary Examiner* — Pho M Luu
(74) *Attorney, Agent, or Firm* — Lowenstein Sandler LLP

(57) ABSTRACT

Control logic in a memory device initiates a program operation on the memory device, and causes a program voltage to be applied to a selected wordline of the memory array during a program phase of the program operation. The control logic further causes a select gate drain coupled with a string of memory cells in the memory array to deactivate during a recovery phase after applying the program voltage, wherein the string of memory cells comprises a plurality of memory cells, and wherein each memory cell of the plurality of memory cells is coupled to a corresponding wordline of a plurality of wordlines in the memory array.

20 Claims, 6 Drawing Sheets

US 11,749,359 B2

SHORT PROGRAM VERIFY RECOVERY WITH REDUCED PROGRAMMING DISTURBANCE IN A MEMORY SUB-SYSTEM

RELATED APPLICATIONS

This application is a continuation of U.S. patent application Ser. No. 17/689,862, filed Mar. 8, 2022, which is a continuation of U.S. patent application Ser. No. 16/946,273, filed Jun. 12, 2020, now U.S. Pat. No. 11,282,582, the entire contents of each of which is hereby incorporated by reference herein.

TECHNICAL FIELD

Embodiments of the disclosure relate generally to memory sub-systems, and more specifically, relate to short program verify recovery phases with reduced programming disturbance in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
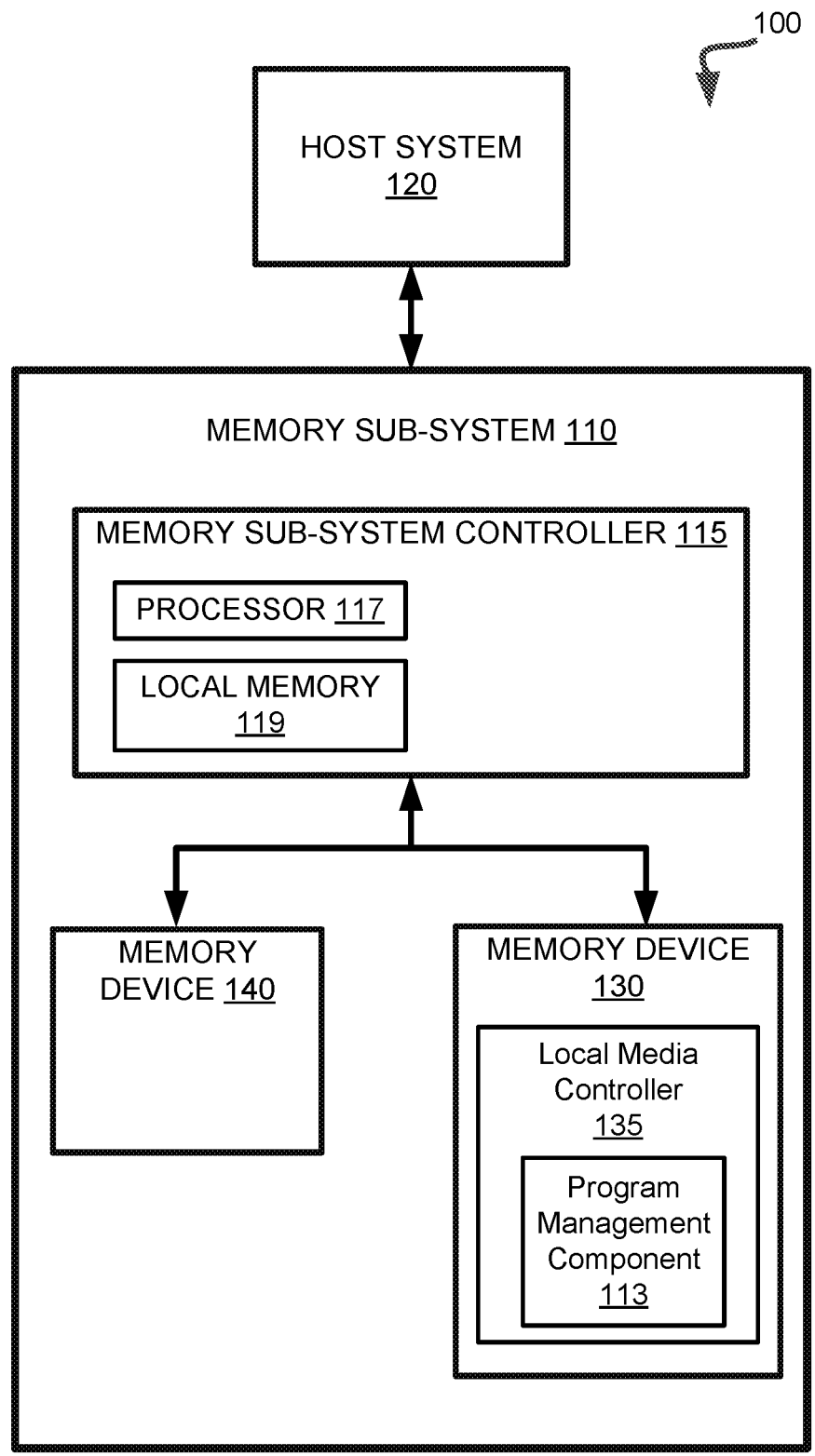
FIG. 1 illustrates an example computing system that includes a memory sub-system in accordance with some embodiments of the present disclosure.

Aspects of the present disclosure are directed to short program verify recovery phases with reduced programming disturbance in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. A data block hereinafter refers to a unit of the memory device used to store data and can include a group of memory cells, a word line group, a word line, or individual memory cells. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

During a programming operation, a selected memory cell(s) can be programmed with the application of a programming voltage to a selected word line. Due to the word line being common to multiple memory cells, unselected memory cells can be subject to the same programming voltage as the selected memory cell(s). If not otherwise preconditioned, the unselected memory cells can experience effects from the programming voltage on the common word line. These programming voltage effects can include the condition of charge being stored in the unselected memory cells which are expected to maintain stored data. This programming voltage effect is termed a "programming disturbance" or "program disturb" effect. The program disturb effect can render the charge stored in the unselected memory cells unreadable altogether or, although still apparently readable, the contents of the memory cell can be read as a data value different than the intended data value stored before application of the programming voltage.

The presence of residue electrons, such as electrons trapped or otherwise remaining on a charge storage structure after an earlier operation (e.g., a program verify operation), can contribute to the program disturb effect. At the end of a program verify operation, for example, a pass voltage (Vpass) applied to the word lines that are not being programmed ramps down and word lines on the source side having a high threshold voltage will cut off prior to word lines with a lower threshold voltage. Therefore, electrons will be trapped in the channel region (i.e., the pillar) of array transistors connected to the word lines with the lower threshold voltage (i.e., between the cut off word lines) and become residue electrons. Since the channel region (i.e., the pillar) in some non-volatile memory devices is a floating channel that may not be connected to a bulk grounded body, there is generally no path for residual electrons in the channel region to discharge other than through towards the source of the memory string. These residue electrons can contribute to program disturb in a number of ways. For example, regular data word lines (i.e., word lines lower down the string) can suffer from hot-electron ("hot-e") disturb where a large voltage differential between the gate and source causes the residue electrons to be injected from a drain depletion region into the floating gate. In addition, the top few word lines in the string might suffer from insufficient boosting when the channel material of unselected memory cells is at a voltage sufficiently different than the programming voltage. This difference in voltage can initiate an electrostatic field of sufficient magnitude to change the charge on a word line and cause the contents of the memory cell to be programmed inadvertently or read incorrectly.

During a program operation on a non-volatile memory device, certain phases can be encountered, including program, program recovery, program verify, and program verify recovery. Since relatively high voltages are applied during the program and program verify phases, the program recovery and program verify recovery phases allow the device to recover from the high voltage modes to discharge internal nodes, etc. For example, a high program voltage can be applied during a program phase, followed by a program recovery phase where the nodes are discharged. Then a verify voltage can be applied during a program verify phase, followed by a verify recovery phase. During the recovery phases all signals are ramped down to some lower voltage level. If the duration of the recovery phase is long enough, electron-hole pair generation and recombination occurring inside the polysilicon channel will tend to bring the uneven channel potential due to the residue electrons across the pillar back to a certain level (e.g., 0 volts). During this process, source side residue electrons are recombined with the generated holes and hence the number of remaining residue electrons decreases. A longer program verify recovery phase, however, hurts device performance and introduces undesired latency. If the program verify recovery phase is shortened though, a larger number of residue electrons are retained (e.g., from the program verify operation), leading to increased program disturb.

Aspects of the present disclosure address the above and other deficiencies by implementing a short program verify recovery phase with specific parameters designed to reduce program disturb in a memory sub-system. In one embodiment, the memory sub-system applies a negative voltage (e.g., −1 volts) to each data word line of a data block during a certain interval of a program verify recovery phase to enhance the electron-hole pair generation and recombination rate during the program verify recovery phase in order to reduce the number of source side residue electrons to a larger extent. The generation and recombination can occur between the selected word line (i.e., the word line being programmed (WLn)) and the adjacent source side word line (i.e., the next word line lower down the string (WLn−1)). Applying a negative voltage to each data word line below the selected word line enhances the potential gradient at this position. As a result, more holes can be locally generated and they can flow to the source side (i.e., towards WLn−1) and can recombine with the source side residue electrons trapped there. The locally generated electrons can flow to the drain side (i.e., towards WLn) and a negative bias applied to the selected word line (WLn) can prohibit the generated hot electrons from being injected. Accordingly, a shorter program verify recovery phase can be utilized resulting in improved program performance in the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a memory device program management component 113 that can oversee, control, and/or manage data access operations, such as program operations, performed on a non-volatile memory device, such as memory device 130, of memory sub-system 110. A program operation, for example, can include a number of phases, such as program, program recovery, program verify, and program verify recovery. Program management component 113 is responsible for causing certain voltages to be applied (or indicating which voltages to apply) to memory device 130 during the program operation. Since relatively high voltages are applied during the program and program verify phases, the program recovery and program verify recovery phases allow the device to recover from the high voltage modes. In general, during the recovery phases all signals are ramped down to some lower voltage level. In one embodiment, program management component 113 causes a word line driver to apply a negative voltage (e.g., −1 volts) to each data word line of a data block during a certain interval of a program verify recovery phase. The negative voltage can enhance the electron-hole pair generation and recombination rate during the program verify recovery phase in order to reduce the number of source side residue electrons to a larger extent. The generation and recombination can typically occur between the selected word line (i.e., the word line being programmed (WLn)) and the adjacent source side word line (i.e., the next word line lower down the string (WLn−1)). Applying a negative voltage to each data word line below the selected word line can enhance the potential gradient at this position. As a result, more holes can be locally generated and they can flow to the source side (i.e., towards WLn−1) and can recombine with the source side residue electrons trapped there. The locally generated electrons can flow to the drain side (i.e., towards WLn) and a negative bias applied to the selected word line (WLn) can prohibit the generated hot electrons from being injected. Further details with regards to the operations of the program management component 113 are described below.

In some embodiments, the memory sub-system controller 115 includes at least a portion of program management component 113. For example, the memory sub-system controller 115 can include a processor 117 (e.g., a processing device) configured to execute instructions stored in local memory 119 for performing the operations described herein. In some embodiments, program management component 113 is part of the host system 110, an application, or an operating system. In other embodiment, local media controller 135 includes at least a portion of program management component 113 and is configured to perform the functionality described herein. In such an embodiment, program management component 113 can be implemented using hardware or as firmware, stored on memory device 130, executed by the control logic (e.g., program management component 113) to perform the operations related to program verify recovery described herein.

Figure 2:
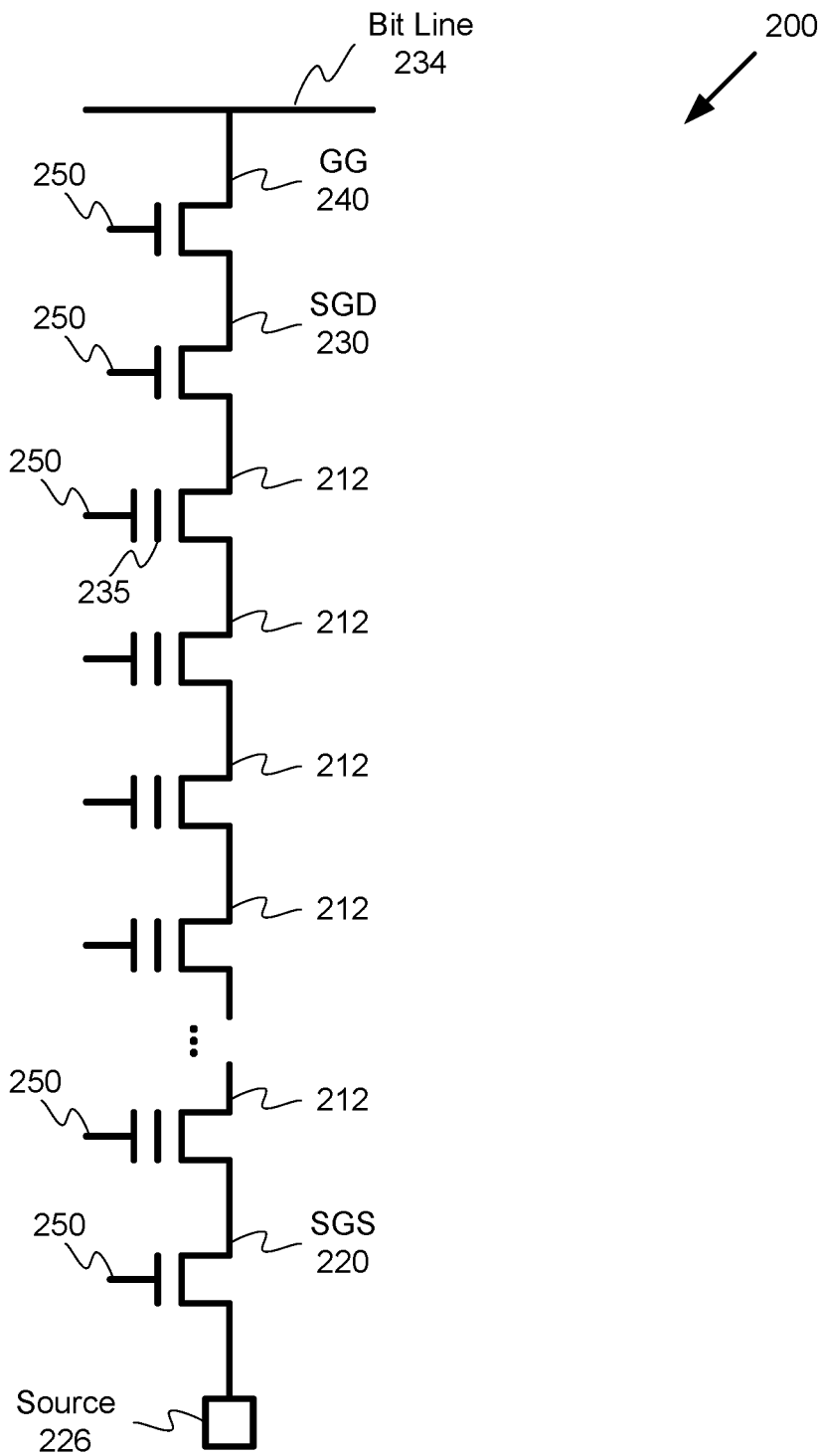
FIG. 2 is a schematic diagram illustrating a string of memory cells in a data block of a memory device in a memory sub-system in accordance with some embodiments of the present disclosure.

FIG. 2 is a schematic diagram illustrating a string 200 of memory cells in a data block of a memory device in a memory sub-system in accordance with some embodiments of the present disclosure. In one embodiment, the string 200 is representative of one portion of memory device 130. The string 200 includes a number of memory cells 212 (i.e., charge storage devices), such as up to 32 memory cells (or more) in some embodiments. The string 200 includes a source-side select transistor known as a source select gate 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a drain select gate 230 (SGD) (typically an n-channel transistor) and a gate induced drain leakage (GIDL) generator 240 (GG) (typically an n-channel transistor) are coupled between one of the memory cells 212 and a data line 234, which is commonly referred to in the art as a "bit line." The common source 226 can be coupled to a reference voltage (e.g., ground voltage or simply "ground" [Gnd]) or a voltage source (e.g., a charge pump circuit or power supply which may be selectively configured to a particular voltage suitable for optimizing a programming operation, for example).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, the drain select gate 230, and the GIDL generator 240 can be controlled by signals on their respective control gates 250.

The control signals can be applied by program management component 113, or at the direction of program management component 113, to select lines (not shown) to select strings, or to access lines (not shown) to select memory cells 212, for example. In some cases, the control gates can form a portion of the select lines (for select devices) or access lines for cells). The drain select gate 230 receives a voltage that can cause the drain select gate 230 to select or deselect the string 200. In one embodiment, each respective control gate 250 is connected to a separate word line (i.e., access line), such that each device or memory cell can be separately controlled. The string 200 can be one of multiple strings of memory cells in a block of memory cells in memory device 130. For example, when multiple strings of memory cells are present, each memory cell 212 in string 200 may be connected to a corresponding shared word line, to which a corresponding memory cell in each of the multiple strings is also connected. As such, if a selected memory cell in one of those multiple strings is being programmed, a corresponding unselected memory cell 212 in string 200 which is connected to the same word line as the selected cell can be subjected to the same programming voltage, potentially leading to program disturb effects. Accordingly, in one embodiment, program management component 113 can cause a word line driver to apply a negative voltage (e.g., −1 volts) to certain control gates 250 of the devices and/or cells in string 200 during a certain interval of a program verify recovery phase. The negative voltage can enhance the electron-hole pair generation and recombination rate during the program verify recovery phase in order to reduce the number of source side residue electrons to a larger extent.

Figure 3:
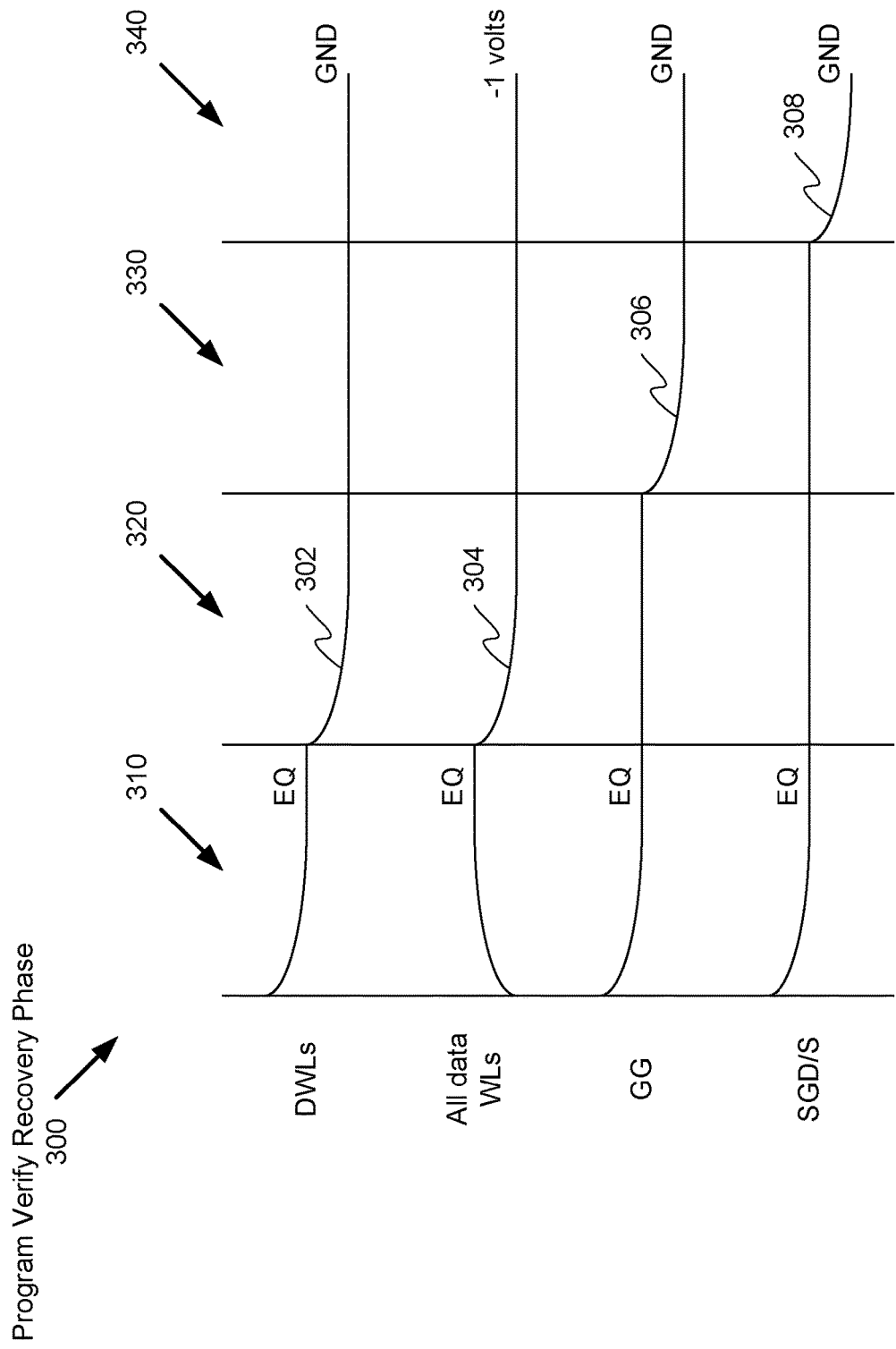
FIG. 3 is a timing diagram for operation of a memory device during a program verify recovery phase of a program operation, in accordance with some embodiments of the present disclosure.

FIG. 3 is a timing diagram 300 for operation of a memory device during a program verify recovery phase of a program operation, in accordance with some embodiments of the present disclosure. During a programming operation performed on a non-volatile memory device, such as memory device 130, certain phases can be encountered, including program, program recovery, program verify, and program verify recovery. During the program phase, a program voltage is applied to selected word lines of the memory device 130, in order to program a certain level of charge to the selected memory cells on the word lines representative of a desired value. During the program verify phase, a read voltage is applied to the selected word lines to read the level of charge stored at the selected memory cells to confirm that the desired value was properly programmed. Since relatively high voltages are applied during the program and program verify operations, the program recovery and program verify recovery phases allow the memory device 130 to recover.

Timing diagram 300 illustrates the program verify recovery phase, according to one embodiment. In this embodiment, the program verify recovery phase includes four time intervals, during which the signals applied to various devices in memory device 130 are ramped down. During a first time interval 310, the signal applied to dummy word lines (DWLs), the signal applied to all data word lines, the signal applied to a word line coupled to a GIDL generator (GG) device, and the signal applied to word lines coupled to the source and drain select gates (SGD/S) are allowed to reach equilibrium (i.e., settle at corresponding voltages used during a previous program verify phase). Once that equilibrium is reached (i.e., all of the signals have settled at a stable value), a second time interval 320 can begin. During the second time interval 320, program management component 113 causes a word line driver to apply a ground signal 302 (e.g., 0 volts) to the dummy word lines and a negative voltage signal 304 (e.g., −1 volt, −2 volts, −3 volts, etc.) to the data word lines. In one embodiment, the dummy word lines include one or more word lines connected to the top most memory cell(s) 212 of string 200 (e.g., just below the drain select gate 230). These cells are generally not used for storing data and thus, the corresponding dummy word lines are treated differently during the program verify recovery phase. In one embodiment, the data word lines include one or more word lines connected to the remaining memory cell(s) of string 200. These cells are generally used for storing data, such as data from host system 120.

In one embodiment, program management component 113 can cause a word line driver to apply the negative voltage to the data word lines where the negative voltage can be seen at the control gates 250 of the corresponding memory cells 212. In one embodiment, program management component 113 sends a signal to the word line driver (or some other component) instructing that driver to apply the negative voltage to the data word lines. The negative voltage can enhance the electron-hole pair generation and recombination rate during the program verify recovery phase in order to reduce the number of source side residue electrons to a larger extent. The generation and recombination can typically occur between a selected word line (i.e., the word line being programmed (WLn)) and the adjacent source side word line (i.e., the next word line lower down the string (WLn−1)). Applying a negative voltage to the selected word line and to each data word line below the selected word line in the string can enhance the channel potential gradient at this position. As a result, more holes can be locally generated in the channel region and they can flow to the source side (i.e., towards WLn−1) and can recombine with the source side residue electrons trapped there. The locally generated electrons can flow to the drain side (i.e., towards WLn) and a negative bias applied to the selected word line (WLn) can prohibit the generated hot electrons from being injected. Once the signal 304 applied to the data word lines reaches the desired negative voltage, a third time interval 330 can begin.

During the third time interval 330, program management component 113 causes a word line driver to apply a ground signal 306 (e.g., 0 volts) to the word line connected to GIDL generator device 240 of string 200. Once the signal 306 applied the GIDL generator device 240 reaches the ground voltage, a fourth time interval 340 can begin. During the fourth time interval 340, program management component 113 applies a ground signal 308 (e.g., 0 volts) to the word line connected to the source and drain select gates 220 and 230 of string 200. It should be understood that the specific voltage levels described herein are merely examples, and that in other embodiments, different voltage levels can be used.

Figure 4:
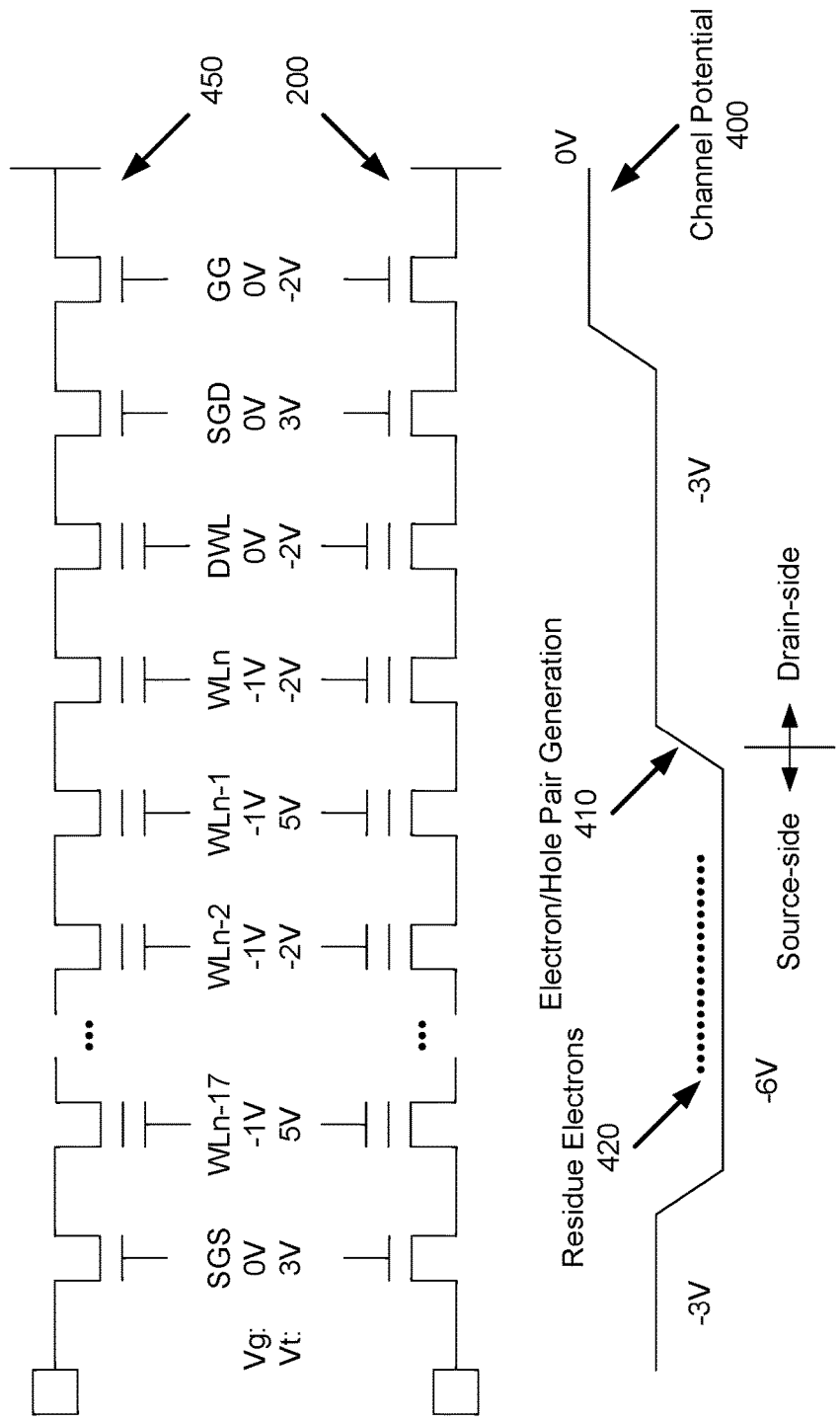
FIG. 4 is a diagram illustrating the channel potential for a string of memory cells during a program verify recovery phase of a program operation, in accordance with some embodiments of the present disclosure.

FIG. 4 is a diagram illustrating the channel potential 400 for a string of memory cells during a program verify recovery phase of a program operation, in accordance with some embodiments of the present disclosure. In one embodiment, the string 200 corresponds to string 200 illustrated in FIG. 2. As described above, the string 200 includes a GIDL generator (GG) device, a drain select gate (SGD) device, a number of memory cells, each connected to a separate word line (WL), and a source select gate (SGS) device. In one embodiment, one or more of the memory cells are connected to a dummy word line (DWL) and are generally not used for storing data. At least one of the memory cells in string 200 can be connected to a selected word line (i.e., the word line being programmed (WLn)) and each remaining memory cells on the source side of the selected word line can be referred to as a data word line (WLn−1, WLn−2, . . . WLn−17). Depending on the embodiment, there can be any number of data word lines. In one embodiment, string 200 represents an unselected sub-block of a data block of memory cells of memory device 130. As described above, the data block can include additional sub-blocks having additional strings of memory cells. For example, string 450 can represent a selected sub-block of the same data block, and can similarly include a number of memory cells and/or other devices which are coupled to the same word lines as the corresponding memory cells and/or other devices of string 200.

In one embodiment, each of the devices in string 200 has an associated threshold voltage (Vt) which represents a voltage at which each device switches from an "off" state to an "on" state, or vice versa. For example, the GIDL generator (GG) device can have a threshold voltage of −2V, the drain select gate (SGD) device can have a threshold voltage of 3V, the memory cell connected to the dummy word line (DWL) can have a threshold voltage of −2V, the memory cell connected to the selected word line (WLn) can have a threshold voltage of −2V, the memory cell connected to WLn−1 can have a threshold voltage of 5V, the memory cell connected to WLn−2 can have a threshold voltage of −2V, the memory cell connected to WLn−17 can have a threshold voltage of 5V, and the source select gate (SGS) device can have a threshold voltage of 3V. In one embodiment, the channel potential 400 of the string 200 represents a difference between a voltage applied at the control gate of each device (i.e., a gate voltage (Vg)) and a representative threshold voltage. In one embodiment, there is a first representative threshold voltage on the drain-side of the selected word line (WLn) and a second representative threshold voltage on the source-side of the selected word line (WLn). Each representative threshold voltage can be the highest threshold voltage on the drain-side and the source-side, respectively. Thus, in the illustrated embodiment, the first representative threshold voltage on the drain-side can be the 3V associated with the drain select gate (SGD) device and the second representative threshold voltage on the source-side can be the 5V associated with the memory device connected to WLn−1 or the memory device connected to WLn−17. Since WLn−1 has the highest threshold voltage on the source-side of the selected word line, the highest number of source-side residue electrons are trapped there at the end of the program verify phase. This represents the worst case scenario in terms of program disturb effect, so the corresponding threshold voltage can be used as the representative threshold voltage.

As described above with respect to FIG. 3, in one embodiment, program management component 113 can cause a word line driver to apply different voltage signals to the gate terminal different devices according to a defined timing sequence. This voltage can be referred to as the gate voltage (Vg). As illustrated in FIG. 4, the gate voltage of the GIDL generator (GG), the drain select gate (SGD) device, the memory cell connected to the dummy word line (DWL), and the source select gate (SGS) device is 0V. In one embodiment, program management component 113 can cause a word line driver to apply a negative voltage to each data word line of a data block during a certain interval of a program verify recovery phase. Thus, the gate voltage of WLn, WLn−1, WLn−2 . . . WLn−17 is −1V. As a result, the channel potential 400 on the drain-side of the selected word line (WLn) is −3V (i.e., a gate voltage of 0V minus the first representative threshold voltage of 3V) and the channel potential 400 on the source side of the selected word line (WLn) is −6V (i.e., a gate voltage of −1V minus the second representative threshold voltage of 5V). Thus, the differential in the channel potential 400 from the drain side to the source side is 3V. Note that if a ground voltage (0V) were applied on the data word lines, the source-side channel potential would be −5V and the differential would be only 2V. Thus, applying the negative voltage to the data word lines increases the potential gradient at the inter-WL region between WLn and WLn−1. As a result, electron/hole pair generation 410 at this position is increased. In one embodiment, this electron/hole pair generation 410 is attributable to the gain boundaries of the poly-silicon channel. A large number of trap sites exist at the gain boundaries and facilitate band-to-band tunneling of generated electrons and holes. Thus, the higher the potential gradient is at a gain boundary, the higher the tunneling probability is at that site.

Since the source side of the selected word line (WLn) has a lower channel potential, the newly generated holes can flow to the source-side (i.e., towards WLn−1) and can recombine with the source side residue electrons 420 trapped there. The locally generated electrons can flow to the drain side (i.e., towards WLn) and a negative bias applied to the selected word line (WLn) can prohibit the generated hot electrons from being injected. The larger differential in the channel potential 400 causes enhanced electron-hole pair generation 410 leading to faster recombination with the residue electrons 420 during the program verify recovery phase. As a result, a shorter program verify recovery phase can be utilized resulting in improved program performance in the memory sub-system 110.

Figure 5:
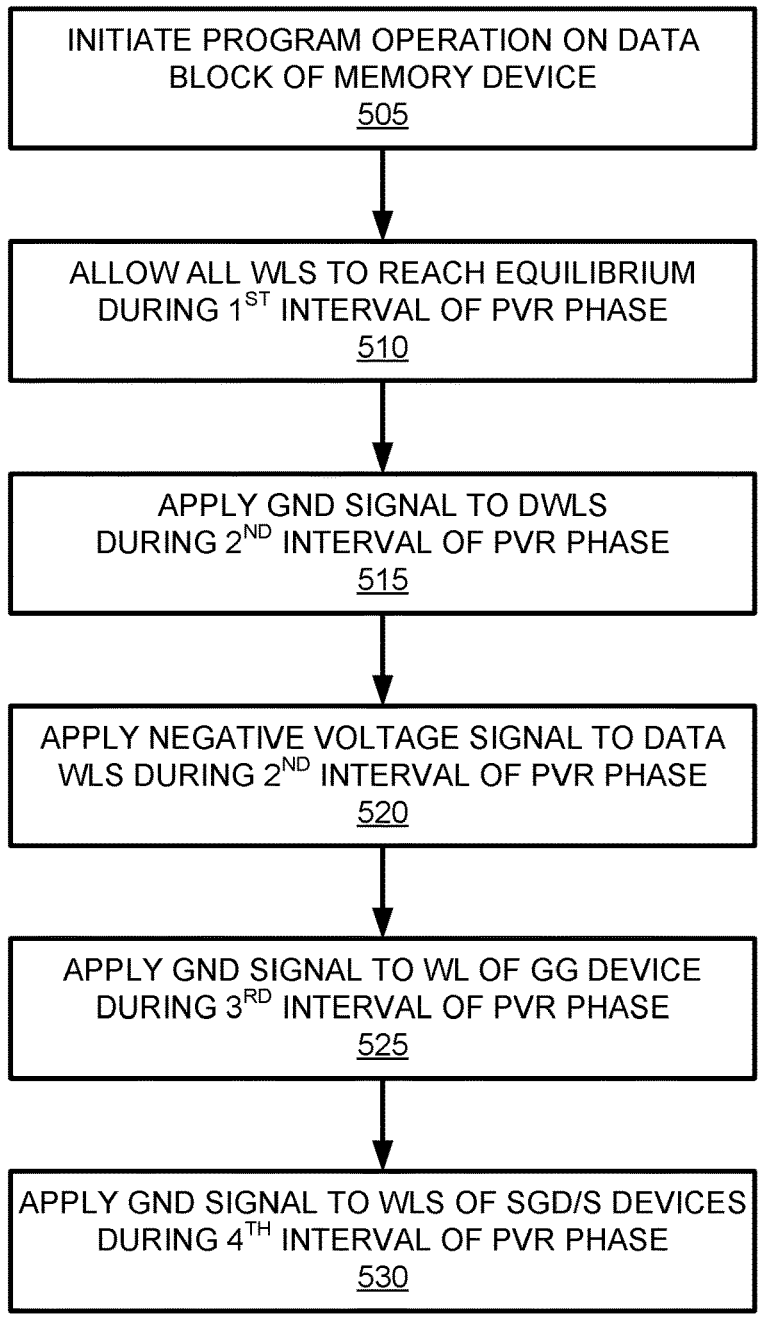
FIG. 5 is a flow diagram of an example method of implementing a short program verify recovery phase with reduced programming disturbance in a memory sub-system, in accordance with some embodiments of the present disclosure.

FIG. 5 is a flow diagram of an example method of implementing a short program verify recovery phase with reduced programming disturbance in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by program management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing logic initiates a program operation on a memory device 130. In one embodiment, the program operation includes a program phase, a program recovery phase, a program verify phase, and a program verify recovery phase, performed in that order. In certain embodiments, each of these phases can be repeated numerous times in a cycle during a single programming operation. During the program phase, a program voltage is applied to selected word lines of the memory device 130, in order to program a certain level of charge to the selected memory cells on the word lines representative of a desired value. During the program verify phase, a read voltage is applied to the selected word lines to read the level of charge stored at the selected memory cells to confirm that the desired value was properly programmed. Since relatively high voltages are applied during the program and program verify operations, the program recovery and program verify recovery phases allow the memory device 130 to recover.

At operation 510, the processing logic allows the signal applied to dummy word lines (DWLs), the signal applied to all data word lines, the signal applied to a word line coupled to GIDL generator (GG) device, and the signal applied to word lines coupled to the source and drain select gates (SGD/S) to reach equilibrium (i.e., settle at corresponding voltages used during a previous program verify phase) during a first time interval 310. Once that equilibrium is reached (i.e., all of the signals have settled at a stable value), a second time interval 320 can begin.

At operation 515, the processing logic causes a word line driver to apply a ground signal 302 (e.g., 0 volts) to the dummy word lines during the second time interval 320. In one embodiment, the dummy word lines include one or more word lines connected to the top most memory cell(s) 212 of string 200 (e.g., just below the drain select gate 230). These cells are generally not used for storing data and thus, the corresponding dummy word lines are treated differently during the program verify recovery phase.

At operation 520, the processing logic causes a word line driver to apply a negative voltage signal to a first plurality of word lines of a data bock of the memory device 130 during the program verify recovery (PVR) phase of the program operation. In one embodiment, the first plurality of data word lines include one or more word lines connected to the remaining memory cell(s) of string 200. These cells are generally used for storing data, such as data from host system 120. In one embodiment, each of the first plurality of word lines is coupled to a corresponding memory cell of a first plurality of memory cells in a string of memory cells in the data block, the first plurality of word lines comprising a selected word line (WLn) associated with the program operation and one or more data word lines adjacent to the selected word line (WLn−1, WLn−2, etc.). In one embodiment, program management component 113 can cause a word line driver to apply the negative voltage to the data word lines where the negative voltage can be seen at the control gates 250 of the corresponding memory cells 212. The negative voltage can enhance the electron-hole pair generation and recombination rate during the program verify recovery phase in order to reduce the number of source side residue electrons to a larger extent. Once the signal 304 applied the data word lines reaches the desired negative voltage, a third time interval 330 can begin.

Depending on the embodiment, program management component 113 can cause the negative voltage to be applied to different word lines. In one embodiment, the one or more data word lines adjacent to the selected word line (WLn) comprise a threshold number of data word lines coupled to memory cells 212 on the source-side of the first memory cell (coupled to WLn). This threshold number can vary from one additional word line (e.g., WLn−1) up to any number of additional word lines. In one embodiment, the threshold number is equal to the total number of word lines in the data block, and thus the one or more data word lines includes all data word lines coupled to memory cells on the source-side of the first memory cell in the string 200 (e.g., WLn to WLn−17). In another embodiment, the threshold number is some lower value, such that the threshold number of data word lines excludes at least one data word line coupled to a memory cell on the source-side of the first memory cell in the string 200 (e.g., WLn to WLn−2). In yet another embodiment, the one or more data word lines comprise data word lines coupled to memory cells on the source-side of the first memory cell within a threshold number of memory cells of a drain-end of the string 200 (i.e., the upper-most word lines). If for example, the threshold number is five, the one or more data word lines would only include WLn and WLn−1, since those word lines plus DWL, SGD, and GG are the only ones within five devices of the drain-end.

In one embodiment, program management component 113 can cause the negative voltage to be applied to the word lines of the data block only during certain program verify recovery phases of the program operation. For example, the program operation might include a plurality of program phases, a plurality of program recovery phases, a plurality of program verify phases, and a plurality of program verify recovery phases, which are repeated in sequence. In one embodiment, the negative voltage is applied to the first plurality of word lines only during a subset of the plurality of program verify recovery phases occurring after a threshold number of the plurality of program phases have occurred. For example, if the threshold value was four, the negative voltage would not be applied during the first four program verify recovery phases, but would be applied in any program verify recovery phases after that. In another embodiment, if the total number of program verify recovery phases to be performed is known in advance, program management component 113 might cause a word line driver to apply the negative voltage only during the law few program verify recovery phases (e.g., during the last five program verify recovery phases. In the first number of program verify recovery phases, a ground voltage can be applied instead of the negative voltage.

At operation 525, the processing logic causes a word line driver to apply a ground signal 306 (e.g., 0 volts) to the word line connected to GIDL generator device 240 of string 200 during the third time interval 330. Once the signal 306 applied the GIDL generator device 240 reaches the ground voltage, a fourth time interval 340 can begin.

At operation 530, the processing logic causes a word line driver to apply a ground signal 308 (e.g., 0 volts) to the word line connected to the source and drain select gates 220 and 230 of string 200 during the fourth time interval 340. Once the signal 308 applied to the source and drain select gates reaches the ground voltage, the program verify recovery phase of the program operation can end.

Figure 6:
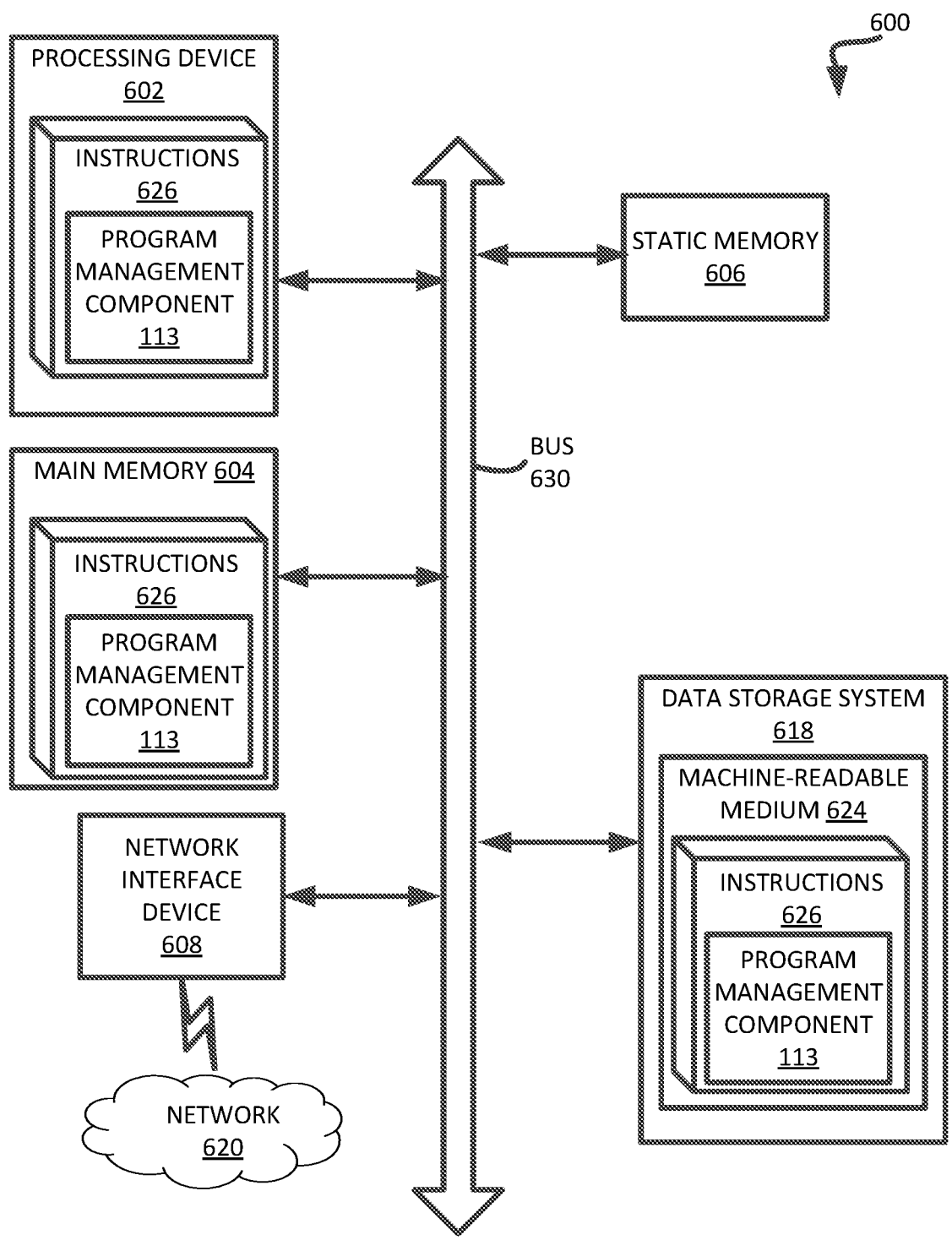
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the program management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
 a memory array; and
 control logic, operatively coupled with the memory array, to perform operations comprising:
  initiating a program operation on the memory array;
  causing a program voltage to be applied to a selected wordline of the memory array during a program phase of the program operation; and
  causing a select gate drain coupled with a string of memory cells in the memory array to deactivate during a recovery phase after applying the program voltage, wherein the string of memory cells comprises a plurality of memory cells, and wherein each memory cell of the plurality of memory cells is coupled to a corresponding wordline of a plurality of wordlines in the memory array.

2. The memory device of claim 1, wherein the control logic is to perform operations further comprising:
 causing a verify voltage to be applied to the selected wordline after the selected wordline during a program verify phase of the program operation.

3. The memory device of claim 1, wherein the control logic is to perform operations further comprising:
 causing a voltage to be applied to a select gate source coupled with the string of memory cells to activate the select gate source during the recovery phase.

4. The memory device of claim 1, wherein the plurality of wordlines comprises the selected wordline associated with the program operation and one or more additional wordlines adjacent to the selected wordline.

5. The memory device of claim 4, wherein the selected wordline is coupled to a first memory cell of the plurality of memory cells in the string.

6. The memory device of claim 5, wherein at least one wordline of the one or more additional wordlines adjacent to the selected wordline is coupled with a second programmed memory cell on a drain-side of the first memory cell in the string of memory cells.

7. The memory device of claim 6, wherein at least one wordline of the one or more additional wordlines adjacent to the selected wordline is coupled with a third unprogrammed memory cell on a source-side of the first memory cell in the string of memory cells.

8. A method comprising:
initiating a program operation on a memory array;
causing a program voltage to be applied to a selected wordline of the memory array during a program phase of the program operation; and
causing a select gate drain coupled with a string of memory cells in the memory array to deactivate during a recovery phase after applying the program voltage, wherein the string of memory cells comprises a plurality of memory cells, and wherein each memory cell of the plurality of memory cells is coupled to a corresponding wordline of a plurality of wordlines in the memory array.

9. The method of claim 8, further comprising:
causing a verify voltage to be applied to the selected wordline after the selected wordline during a program verify phase of the program operation.

10. The method of claim 8, further comprising:
causing a voltage to be applied to a select gate source coupled with the string of memory cells to activate the select gate source during the recovery phase.

11. The method of claim 8, wherein the plurality of wordlines comprises the selected wordline associated with the program operation and one or more additional wordlines adjacent to the selected wordline.

12. The method of claim 11, wherein the selected wordline is coupled to a first memory cell of the plurality of memory cells in the string.

13. The method of claim 12, wherein at least one wordline of the one or more additional wordlines adjacent to the selected wordline is coupled with a second programmed memory cell on a drain-side of the first memory cell in the string of memory cells.

14. The method of claim 13, wherein at least one wordline of the one or more additional wordlines adjacent to the selected wordline is coupled with a third unprogrammed memory cell on a source-side of the first memory cell in the string of memory cells.

15. A memory device comprising:
a string of memory cells in a sub-block of a block of memory cells, wherein the string of memory cells comprises a plurality of memory cells formed around a channel and coupled to a plurality of wordlines, wherein a select gate drain coupled with the string of memory cells is configured to receive a first voltage signal during a verify phase of a program operation performed on the sub-block, the first voltage signal to deactivate the select gate drain during the verify phase.

16. The memory device of claim 15, wherein a select gate source coupled with the string of memory cells is configured to receive a second voltage signal during a recovery phase of the program operation performed on the sub-block, the second voltage signal to activate the select gate source during the recovery phase.

17. The memory device of claim 15, wherein the plurality of wordlines comprises a selected wordline associated with a program operation and one or more additional wordlines adjacent to the selected wordline.

18. The memory device of claim 17, wherein the selected wordline is configured to receive a verify voltage during the verify phase of the program operation.

19. The memory device of claim 18, wherein the selected wordline is coupled to a first memory cell of the plurality of memory cells in the string.

20. The memory device of claim 19, wherein at least one wordline of the one or more additional wordlines adjacent to the selected wordline is coupled with a second programmed memory cell on a drain-side of the first memory cell in the string of memory cells, and wherein at least one wordline of the one or more additional wordlines adjacent to the selected wordline is coupled with a third unprogrammed memory cell on a source-side of the first memory cell in the string of memory cells.

\* \* \* \* \*